Jan. 26, 1971 S. S. CHARSCHAN 3,557,446

METHOD OF FORMING PRINTED CIRCUIT BOARD THROUGH-CONNECTIONS

Filed Dec. 16, 1968

INVENTOR
S. S. CHARSCHAN
BY [signature]
ATTORNEY 3,557,446
Patented Jan. 26, 1971

3,557,446

METHOD OF FORMING PRINTED CIRCUIT BOARD THROUGH-CONNECTIONS

Sidney Samuel Charschan, Levittown, Pa., assignor to Western Electric Company, Incorporated, New York, N.Y., a corporation of New York Continuation-in-part of abandoned application Ser. No. 548,156, May 6, 1966. This application Dec. 16, 1968, Ser. No. 798,545
Int. Cl. B41m *3/08;* B41q *17/00*
U.S. Cl. 29—625 16 Claims

ABSTRACT OF THE DISCLOSURE

A transversely deformable, conductive foil sheet is positioned over one or more holes in, and in contact with, a major surface of a nonconductive substrate. Uniform pressure is applied to the free major surface of the sheet with a hydraulic medium such as a rubber pad. Such pressure extrudes, explodes or ruptures the unsupported portion of the sheet over the hole thereinto to produce a through-connection.

CROSS REFERENCES TO RELATED APPLICATIONS

This is a continuation-in-part of my copending application, Serial No. 548,156, filed May 6, 1966, now abandoned and relates to a Method of Forming Printed Circuit Board Through-Connections.

BACKGROUND OF THE INVENTION

(1) Field of the invention

This invention relates to the manufacture of printed circuit boards and, more particularly, to methods of forming through-connections for printed circuit boards. Accordingly, the general object of this invention is to provide a new and improved method of such a character.

(2) Description of the prior art

In the manufacture of printed circuit boards it is common practice to form circuit patterns on both sides of a board or support. Such circuit patterns may form part of the same overall circuit and, accordingly, it may be desirable to provide conductive interconnections, termed "through-connections," between the patterns and through the board. Presently, several techniques are employed for producing through-connections.

One technique in widespread usage is to drill or punch holes in the board and through the patterns and then to insert eyelets or hollow rivets into the holes. Thereafter, the eyelets or rivets are upset to secure them to the board and to interconnect the patterns. This procedure has proven to be quite time-consuming in that each eyelet or rivet must be individually inserted and upset. Additionally, it is generally necessary to add solder to the eyelets or rivets at their points of contact with the circuit patterns to produce satisfactory electrical interconnection between the patterns.

A second widely used technique is through-hole plating, whereby, the inner walls of the drilled or punched holes are plated with a conductive material to interconnect the patterns. While this technique has met with some success, considerable difficulty has been encountered with latent defects, such as ion entrapment, voids, thin walls, etc.

Another technique which has been employed is to form the through-connections from conductive sheets used to form the circuit patterns. In one approach this is accomplished by applying heat and pressure to press the conductive sheets on opposite sides of the board into contact with each other at the point where a through-connection is desired. This causes the intervening board, made of a dielectric material, typically a deformable plastic, to project through one of the sheets. The sheets are then pierced where they contact to remove the projecting dielectric material and to form the through-connection.

In accordance with another but similar approach, holes are first drilled in the board and then respective conductive sheets are then bonded to opposite sides of the substrate. Thereafter, the conductive sheets are deformed at each hole location to form opposed conical depressions in each hole. Next, a pair of opposed welding tips are inserted into each depression to spot weld the bases of the depressions together. Holes are then punched through the welded bases to complete the through-connections.

One of the problems with the last two techniques is that they require a multiplicity of forming steps which, of course, are time-consuming, especially where a single tool or set of tools is used for each step and the tools or board are indexed for each operation. More importantly, prior to or during each step, whether a single tool or a plurality of simultaneously actuated tools are employed, the tool or tools involved have to be registered accurately with the holes. This registration is a very laborious task which requires a high degree of skill and care, and which becomes even more difficult as the size of the boards and holes decreases and as the intricacy of the circuit patterns increases. In fact, differences of hole placement and size between boards, occasioned by deviations from normal dimensions, might be such as to preclude use of sets of simultaneously actuated tools. Further, even if it were possible to use such tools, it would be necessary to have separate sets of tools for boards with different hole patterns or, alternatively, to use equipment of the type wherein the number and placement of the tools of each set can be varied. Each alternative, as should be apparent, results in slow, complex and costly production.

Other prior art is discussed in the detailed description, below.

SUMMARY OF THE INVENTION

Accordingly, it is another object of this invention to provide a new and improved method of simultaneously forming a plurality of through-connections for printed circuit boards, independently of the hole pattern and in an expeditious, reliable and economic manner.

In its most general form, the present invention contemplates positioning a transversely deformable, conductive foil sheet in contact with a major surface of a non-conductive substrate or board over one or more holes therethrough. Uniform pressure is applied to the free major surface of the sheet with a hydraulic medium such as a rubber pad. Such pressure extrudes, explodes, or ruptures the unsupported portion of the sheet over the hole thereinto.

More specifically, the foregoing and other objects of the invention are attained, in accordance with certain principles of the invention, by placing respective sheets of the conductive foil in contact with opposite sides of the nonconductive substrate or board having one or more holes therethrough. Uniform pressure is applied to the free major surface of the sheets with the hydraulic medium, such as the rubber pad, to extrude, explode or rupture the sheet into each hole in a manner such that the foil from one side of the board ruptured into each hole is formed around the periphery thereof in contact with the ruptured foil from the other side of the board, thereby forming an open-ended, conductive through-connection in each hole.

BRIEF DESCRIPTION OF THE DRAWINGS

The invention, as well as its objects, advantages and features, will be more fully understood from the following detailed description of specific embodiments thereof, when considered in conjunction with the appended drawings, wherein.

DETAILED DESCRIPTION

Embodiment I

Figure 1:
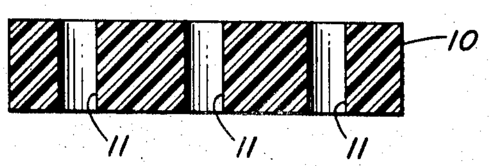
FIGS. 1–6, inclusive, illustrate the steps involved in forming printed circuit board through-connections in accordance with one embodiment of the invention.

Referring to FIG. 1 of the drawings, there is shown a board 10 composed of any suitable nonconductive material, such as an A or B stage epoxy resin, a phenolic or phenol fabric, or other thermoplastic or thermosetting material. Alternatively, the board 10 may be an epoxy-covered, or other plastic-covered metal board of the type disclosed in the copending application of D. Dinella, Ser. No. 220,383, filed Aug. 30, 1962, and assigned to the same assignee as the instant application. Accordingly, the term nonconductive board as used herein contemplates a board either wholly or partially composed of a nonconductive material. Illustratively, the invention will be described and illustrated as utilizing a board 10 composed of an epoxy resin.

The first step in the process, as shown in FIG. 1, is to form a plurality of holes 11—11 completely through the board 10 by any suitable means, such as drilling or punching. The number of holes 11—11 and their placement in the board 10 (i.e., the hole pattern) may correspond respectively to the number and desired location of through-connections for the particular circuit patterns to be ultimately formed on the board. Alternatively, the hole pattern may be a standard pattern suitable for forming through-connections for many different type circuit patterns. It is important to note that the holes 11—11 are formed completely through the board 10 and not merely partially through the board 10. In other words, it is necessary that the holes 11—11 are neither "blind" holes nor channels nor grooves in the board 10, as explained below.

Figure 2:
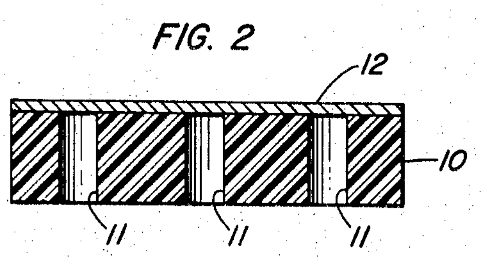

As seen in FIG. 2, after formation of the holes 11—11, one major surface of a sheet 12 of conductive material, such as copper foil, is placed in contact with one side or major surface of the board 10. Prior to being placed on the board 10, the side or surface of the sheet 12 which is to contact the board may be coated with a thin adhesive layer (not shown) to enable subsequent bonding of the sheet to the board by means of heat and/or pressure. Illustratively, for the epoxy board 10 and the copper sheet 12, an epoxy or phenolic-based adhesive may be employed for this purpose. Other adhesive media, such as copolymers of ethylene may also be used.

Next, the board-sheet sandwich or assemblage is placed in a female die section 13 (FIG. 3) of a die set having a mating male die section 14. A hydraulic medium, such as a confined rubber pad 16, is then placed over and in contact with the free major surface of the sheet 11. While many different type rubber compositions have been found to be suitable for the pad 16, advantageously such pad is composed of pure gum rubber. The pad 16 is confined by the upstanding walls of the female die section 13.

Figure 3:
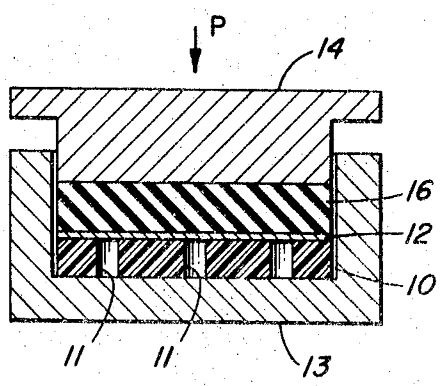
Figure 4:
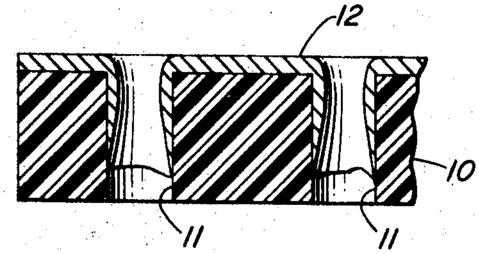

Pressure P (due to a force) is then applied to the male die section 14, in the direction shown by the arrow in FIG. 3, to force the male die section 14 against the confined rubber pad 16. Such forcing of the die section 14 compresses the confined pad 16 to apply uniform pressure to the free major surface of the sheet 12. The pressure may be applied to the male die section 14 by placing the die set 13–14 in a conventional press. Compression of the confined pad 16 forces rubber into the holes 11—11 by forcing generally conical or cylindrical, unsupported portions of the sheet 12, which overlie such holes 11—11, thereinto. Lateral deformation or movement of the rubber pad 16 is prevented by the upstanding sidewalls of the female die section 13. This forcing of the rubber ultimately extrudes or explodes the sheet portions overlying the holes 11—11 into such holes, rupturing the sheet portions in each hole and forming it around the inner periphery thereof, as seen in FIG. 4. The male die section 14 is now moved out of engagement with the pad 16, whereupon the pad returns to its original shape. The manner of applying the force to the pad is important as discussed below.

It should be noted that the relative hardness of the pad 16, the temper and thickness of the sheet 12, the size of the holes and the amount of pressure applied, all interact in arriving at the desired extrusion shown in FIG. 4. These factors are selected such that the copper neither shears at the upper edge of the holes 11—11, nor is insufficiently extruded so as to form a closed depression in each hole, rather than the open-ended, conforming insert shown in FIG. 4.

Generally speaking, the above factors may be empirically adjusted to obtain the desired extrusion or explosion. However, certain optimum values for these factors exist and are shown below:

(1) Pad 16—pure gum rubber, having a durometer of about 20 to 40, and preferably about 30, ⅛ to ½ inch thick;

(2) Sheet 12—any metal foil, but preferably fully annealed copper foil, .0007 to .004 inch thick; may be coated with an adhesive;

(3) Board 10—any of the previously mentioned materials; however, an epoxy-coated (A or B stage) metal board or a phenolic board are usual; .035 to .125 inch thick board;

(4) Holes 11—11—Diameter .04 to .1 inch; height .035 to .125 inch;

(5) Pressure P—Increased from minimal value only until extrusion occurs.

As discussed above, two factors are especially important, viz, the height of the holes 11—11 which go through the board and the character of the pressure P.

The prior art shows a method of embedding metal foil into blind holes and channels molded into a nonconductive substrate. Such embedding is effected by covering the holes and channels with a metal foil and applying pressure thereto with a yieldable plastic. The pressure application shears the foil at the edge of the holes and channels and then pushes the sheared foil into the holes and channels for retention therein by virtue of some slight stretching of the sheared foil during shearing.

This prior art, however, points out that the holes or channels have a maximum depth of .018 inch and rounded bottom portions which are only .005 inch below the surface of the substrate. Thus, although there is the slight stretching of the foil, such stretching is quickly terminated when the bottom of the holes or channels are contacted by the foil; because no further stretching can occur, shearing follows. In the present invention, the holes 11—11 are not only at least twice as deep (.035 inch) as those of the prior art, but are also not "blind." Thus, the stretching of the foil sheet 12 proceeds unhindered until the desired extrusion or explosion occurs.

Moreover, the prior art is silent on the amount of pressure applied to the foil through the yieldable plastic; nevertheless, such pressure is sufficient to effect shearing. In the present invention, due to the possibility of empirically adjusting certain factors, the amount of pressure P applied to the foil sheet 12 through the pad 16 by the male die section 14 is variable; however, such pressure P is made only large enough to effect the desired extrusion or explosion.

Figure 5:
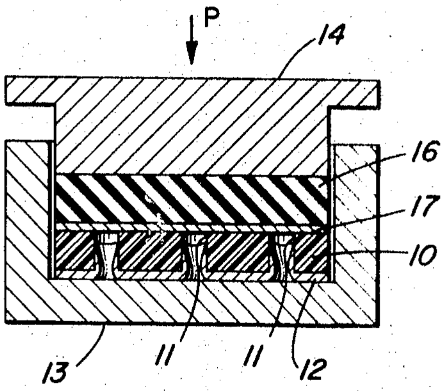
Figure 6:
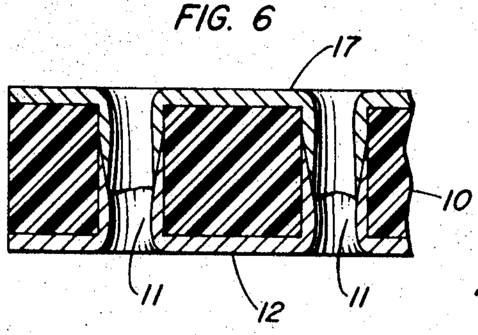

Referring to FIG. 5, a second copper sheet 17, which may be adhesive-coated, is now placed in contact with the opposite side or major surface of the board 10. The resultant sandwich or assemblage, sheet side up, is then placed in the female die section 13. Next, the pad 16 is placed over the sheet 17 and pressure P is applied to the male die section 14. This results in unsupported portions of the sheet 17 being extruded or exploded into the holes 11—11 as described above. As seen in FIG. 6, the extruded or exploded portions of the sheet 17 rupture or explode in each hole 11—11 and are formed around the inner periphery thereof in overlapping contact with the extruded or exploded portions of the sheet 12. This results in an open-ended conductive through-connection in each hole 11.

After formation of the through-connections, the board may be heated, under slight pressure, to bond the sheets 12 and 17 to the epoxy by curing the adhesive on the sheets 12 and 17, if such was used. The board is now ready for formation of the desired circuit patterns. As is conventional circuit pattern formation may be effected by photo-etching of the sheets 12 and 17.

Embodiment II

In this embodiment, two or more conductive sheets are exrtuded or exploded into holes in a board during the same step.

Figure 7:
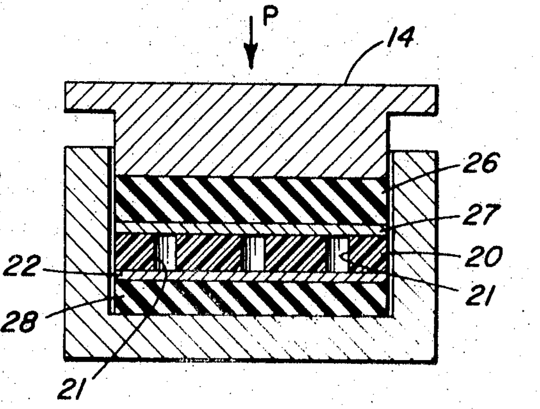
FIG. 7 illustrates the forming of printed circuit board through-connections in accordance with another embodiment of the invention.

Referring to FIG. 7, a board 20 having holes 21—21 is sandwiched between two conductive sheets 22 and 27 and top and bottom rubber pads 26 and 28, the top pad 26 being softer or more easily deformable than the bottom pad 28. Specifically, the top pad 26 may be pure gum rubber of durometer less than 30, while the bottom pad 28 may be pure gum rubber of durometer greater than 30.

The assemblage or sandwich thus constituted is placed in the female die section 13. Pressure P is then applied to the male die section 14. This results first in the rubber of the softer top pad 26 being forced through the holes 21—21 to extrude or explode unsupported portions of the sheet 22 thereinto, in a manner similar to that illustrated in FIG. 4. As the pressure P increases, the firmer bottom pad 28 is forced into the holes 21—21, causing the rubber of the softer top pad to be forced out of the holes and extruding or exploding unsupported portions of the sheet 27 into the holes 21—21, in an overlapping, contacting manner similar to that illustrated in FIG. 6. Accordingly, the through-connections are formed in essentially one step. The board 20 may then be subjected to additional processing as was the board 10 of Embodiment I.

It should be noted that while in both embodiments the copper has been bonded to the board after the extrusion or explosion of the through-connections, the bonding could just as well take place prior to any such extrusion. Alternatively, the bonding could take place during the extruding step or steps. In this latter case, the epoxy may be in what is termed the B stage of cure, which is a stage of partial cure. Heat may then be applied during the extruding, the combination of the heat with the applied pressure bonding the copper to the epoxy and also effecting curing of the epoxy. Advantageously, if this technique is employed, the sides of the copper sheets which are to contact the epoxy may first be oxidized to promote good adherence between the two materials.

As should be apparent from the foregoing description, the invention may be practiced without regard to the number of through-connections required or the location thereof. Whether one through-connection or many are required, the steps involved are the same and the through-connections are formed simultaneously without the need for any indexing or complex tooling. Further, the same tooling without any modifications or adjustments, may be used regardless of the through-connection pattern.

It is to be understood that the term "hydraulic" as used herein means any medium, either solid, liquid or gaseous, which, when a force is exerted thereon, flows in a fluidic manner. Preferebly, the medium is elastic or resilient so as to be reusable for a great many extrusion operations; however, media which are permanently deformed after one operation are also within the contemplation of the invention.

It is to be further understood that the above-described arrangements are simply illustrative of the application of the principles of the invention. Various other arrangements may be readily devised by those skilled in the art which will embody the principles of the invention and fall within the spirit and scope thereof.

What is claimed is:

1. A method of forming an open-ended, electrically conductive through-connection in a nonconductive substrate comprising the steps of:
- forming at least one hole through said substrate;
- positioning a first, conductive, laterally deformable sheet in contact with at least a portion of one major surface of said substrate, unsupported portions of said first sheet overlying said hole at one terminus thereof; and then
- extruding said unsupported first sheet portions into said hole and rupturing said unsupported portions within said hole by applying uniform pressure to the free major surface of said first sheet with a first hydraulic medium, so that said ruptured portions contact the inner periphery of said hole but remain contiguous with said first sheet.

2. The method of claim 1 wherein:
- said positioning step includes the placement of a second conductive, laterally deformable sheet in contact with at least a portion of another major surface of said substrate, unsupported portions of said second sheet overlying said hole at the other terminus thereof; and
- said extruding step includes extruding said unsupported second sheet portions into said hole and rupturing said unsupported second sheet portions within said hole by applying uniform pressure to the free major surface of said second sheet with a second hydraulic medium so that said ruptured portions of said second sheet contact both the inner periphery of said hole and said ruptured portions of said first sheet, but remain contiguous with said second sheet, thereby forming an open-ended, electrically conductive through-connection in said substrate.

3. The method of claim 1 wherein said pressure application is effected by forcing a pad of a resilient material against said sheets while confining said pad to prevent movement and deformation thereof in a direction transverse to the direction of said applied pressure.

4. The method of claim 3 wherein said resilient material is a rubber having a duromoter within the range 20 to 40.

5. The method of claim 2 wherein said force application is effected by forcing simultaneously first and second pads of resilient material respectively against said first and second sheets, said first pad having a lower durometer than said second pad, whereby said unsupported portions of said first sheet are extruded and ruptured into said hole before said unsupported portions of said second sheet are extruded and ruptured into said hole.

6. The method of claim 5 wherein said resilient material is a rubber having a duromoter within the range 20 to 40.

7. The method of forming a through-connection for a printed circuit board, which comprises the steps of:
- (a) forming at least one hole through a nonconductive board;
- (b) placing deformable sheets of conductive material in contact with opposite sides of the board over the hole; and
- (c) extruding said conductive material into said hole and rupturing said extruded material within said hole by applying uniform pressure to said sheets of conductive material with a hydraulic medium, so that said ruptured material from said opposite sides of the board contact the inner periphery of said hole, remain contiguous with their respective sheets of conductive material and contact the conductive material from the other side of the board, thereby forming open-ended, conductive through-connections in the hole.

8. The method of claim 7 wherein the hydraulic medium is composed of rubber.

9. The method of claim 7 wherein the sheets of conductive material are bonded to the nonconductive board prior to step (c).

10. The method of claim 7 wherein the sheets of conductive material are bonded to the nonconductive board after step (c).

11. The method of claim 7 wherein step (c) is performed by contacting each side of the board with a rubber medium and then applying pressure to the opposing noncontacting side of the rubber medium, while preventing movement of the rubber in a direction transverse to that of the applied pressure to force rubber into the hole and thereby extrude the conductive material therein in the manner stated.

12. The method of claim 11 wherein at least the opposed sides of the nonconductive board and the wall of the hole thereof are composed of an epoxy resin, and the sheets of conductive material are composed of copper.

13. The method of claim 12 wherein the epoxy is in a partially cured stage and heat is applied during step (c) to bond the copper to the epoxy and to cure the epoxy.

14. The method of claim 13 wherein the sides of the copper sheets which contact the epoxy are treated to promote good adhesion.

15. The method of forming a plurality of through-connections for a printed circuit board, which comprises the steps of:

(a) forming a plurality of holes through a nonconductive board;

(b) placing a first sheet of conductive material in contact with a first side of the board;

(c) placing a first elastic pad in contact with the first sheet;

(d) extruding conductive material into the holes, rupturing the material within each hole and forming the ruptured material around the periphery of each hole by applying pressure to the first pad to compress the first pad;

(e) placing a second sheet of conductive material in contact with the opposite side of the board;

(f) placing a second elastic pad in contact with the second sheet; and (g) extruding conductive material into the holes, rupturing the material within each hole and forming the ruptured material around the periphery of each hole in contact with the ruptured material of the first sheet by applying pressure to the second pad to compress the second pad, thereby forming an open-ended, conductive through-connection in each hole.

16. The method of forming a through-connection for a printed circuit board including a nonconductive substrate having at least one hole therein and respective sheets of a conductive material in contact with opposite sides of the substrate, which method comprises:

extruding conductive material into the hole, rupturing the extruded material within the hole and forming the ruptured material around the periphery of the hole in contact with formed material from the other side, said extruding, rupturing and forming being effected by applying pressure to each side of the substrate with a compressible medium, thereby forming an open-ended, conductive through-connection in the hole.

References Cited

UNITED STATES PATENTS

| | | | |
|---|---|---|---|
| 2,683,839 | 7/1954 | Beck | 174—68.5 |
| 2,889,393 | 6/1959 | Berger | 174—68.5 |
| 2,974,284 | 3/1961 | Parker | 174—68.5X |
| 3,239,895 | 3/1966 | Stuckert. | |
| 3,431,350 | 3/1969 | Habrecht | 174—68.5 |
| 3,357,081 | 12/1967 | Prestige | 29—432X |
| 2,925,645 | 2/1960 | Bell et al. | |
| 2,772,501 | 2/1958 | Malcolm. | |
| 3,334,395 | 8/1967 | Cook et al. | 174—68.5 |
| 3,375,576 | 4/1968 | Klein et al. | 174—68.5 |

FOREIGN PATENTS

| | | |
|---|---|---|
| 1,010,335 | 1/1965 | Great Britain. |

JOHN F. CAMPBELL, Primary Examiner

R. W. CHURCH, Assistant Examiner

U.S. Cl. X.R.

29—421, 628; 72—55; 174—68.5; 339—17.